United States Patent [19]

Song et al.

[11] Patent Number: 5,339,117

[45] Date of Patent: Aug. 16, 1994

[54] TUNING APPARATUS FOR TELEVISION SYSTEM AND METHOD OF CONTROLLING THE SAME

[75] Inventors: Han B. Song, Kumi; Jae K. Lee, Daeku; Woon K. Baik, Kumi, all of Rep. of Korea

[73] Assignee: Gold Star Co., Ltd., Seoul, Rep. of Korea

[21] Appl. No.: 897,423

[22] Filed: Jun. 12, 1992

[30] Foreign Application Priority Data

Jul. 31, 1991 [KR] Rep. of Korea ............... 91-1321

[51] Int. Cl.$^5$ .......................................... H04N 5/50
[52] U.S. Cl. ................................ 348/733; 348/570; 334/11; 334/49; 455/170.1; 455/180.1; 455/181.1; 455/184.1
[58] Field of Search ............. 358/191.1, 192.1, 193.1; 455/161.1, 166.1, 169.1, 170.1, 171.1, 179.1, 180.1, 154.1, 158.1, 158.2, 158.3, 158.4, 188.8, 181.1, 184.1, 186.1; 334/11, 14, 15, 47, 49, 50, 52; H04N 5/50

[56] References Cited

U.S. PATENT DOCUMENTS

| | | | |
|---|---|---|---|
| 3,769,620 | 10/1973 | Kimura et al. | 334/15 |
| 4,128,821 | 12/1978 | Kato et al. | 334/51 |
| 4,307,467 | 12/1981 | Bridgewater | 455/176.1 |
| 4,317,225 | 2/1982 | Henderson et al. | 358/193.1 |
| 4,363,134 | 12/1982 | Murata et al. | 455/161.1 |
| 4,631,585 | 12/1986 | Wine | 358/192.1 |
| 4,805,230 | 2/1989 | Tanaka | 358/191.1 |
| 4,918,531 | 4/1990 | Johnson | 358/193.1 |
| 5,182,646 | 1/1993 | Keenan | 358/193.1 |

Primary Examiner—Mark R. Powell
Assistant Examiner—Jeffrey S. Murrell
Attorney, Agent, or Firm—Birch, Stewart, Kolasch & Birch

[57] ABSTRACT

Tuning apparatus for a television system, comprising a rotary encoder having a slidable and rotatable channel changing mechanism, the rotary encoder outputting a plurality of signals with a phase difference with respect to one another, corresponding to a channel change in accordance with the rotation of the channel changing mechanism, a microcomputer for calculating a channel number to be changed in accordance with the output signals from the rotary encoder and outputting channel receive data corresponding to the calculated channel number, and a tuner for receiving a television broadcasting signal of a channel corresponding to the channel receive data from the microcomputer. Also, there is provided a method of controlling tuning in a television system, comprising the steps of: generating two signals with a phase difference with respect to each other, recognizing channel increment direction, channel decrement direction and generation of an error, according to states of the two signals, calculating a new channel number to be changed by the system according to whether the recognized channel change direction is the channel increment or decrement direction, and providing the tuner with channel receive data corresponding to the calculated new channel number such that the tuner selects a new channel.

14 Claims, 16 Drawing Sheets

TUNING APPARATUS FOR TELEVISION SYSTEM AND METHOD OF CONTROLLING THE SAME

BACKGROUND OF THE INVENTION

1. Field of the Invention

The present invention relates in general to a tuning apparatus for a television system and a method of controlling the same, and more particularly to a tuning apparatus for a television system utilizing a rotary encoder, instead of a rotary switch and a remote controller, and a method of controlling the same.

2. Description of the Prior Art

With reference to FIG. 1, there is shown a front view of a conventional television set with a tuning apparatus of the rotary type. As shown in this drawing, the television set comprises a very high frequency (VHF) channel indicator 1, a VHF channel selector 2, a VHF channel fine tuning adjusting knob 3, an ultra high frequency (UHF) channel indicator 4, an UHF channel selector 5, an UHF channel fine tuning adjusting knob 6, a power switch and volume adjusting switch 7, and a control part 8 for controlling color, tint, brightness, and contrast, each being disposed on an external panel.

As shown in FIG. 1, the conventional television set with the tuning apparatus of the rotary type comprises separate components for selecting the VHF and UHF channels and separate components for adjusting fine tuning of the VHF and UHF channels.

FIG. 2 is a block diagram of a conventional television system with a tuning apparatus of the rotary type and the remote control type. The illustrated system comprises a key matrix unit 9 for outputting an electric signal of a desired level corresponding to VHF and UHF channels in accordance with a selection by the user, a remote controller 10 for outputting a remote radio signal corresponding to each channel in accordance with the selection of the user, a remote signal receiver 10a for receiving the remote radio signal from the remote controller 10 and amplifying the received signal by a predetermined amplification factor, a microcomputer 12 for controlling channel increment and decrement and channel selection of response to output signals from the key matrix unit 9 and the remote signal receiver 10a, a mechanical rotary knob 11 including a plurality of mechanical contacts, for outputting a channel select signal in accordance with a selection by the user, a tuner 13 for selectively outputting a broadcasting signal received through an antenna ANT in accordance with an output signal from the microcomputer 12 or an output signal from the mechanical rotary knob 11, an intermediate frequency (IF) processor 14 for IF-processing an output signal from the tuner 13, a detector 15 for detecting a desired composite video signal from an output signal from the IF processor 14, an audio processor 16 for processing only audio signals of an output signal from the detector 15 and outputting the processed audio signal through a speaker 19, and a video processor 17 for processing only the video signal of the output signal from the detector 15 and outputting the processed video signal through a CRT 18. Herein, the block designated by the reference numeral 20 corresponds to the construction of the television system with the tuning apparatus of the rotary type and the block designated by the reference numeral 21 corresponds to the construction of the television system with the tuning apparatus of the remote control type.

The operation of the conventional television systems with the tuning apparatus of the rotary type and the remote control type which is constructed as mentioned above will now be described.

First, if the operation of the conventional television system with the tuning apparatus of the remote control type will be described.

As shown in FIG. 4, if the user selects a desired channel by the key matrix unit 9 or the remote controller 10 when the television system is powered on, a channel select signal is inputted to the microcomputer 12. As a result, a channel number corresponding to the channel select signal is displayed by a display (not shown) under control of the microcomputer 12, Simultaneously, the tuner 13 outputs the broadcasting signal through an antenna ANT corresponding to the selected channel under another control of the microcomputer 12. The broadcasting signal outputted from the tuner 13 is applied to the audio processor 16 and the video processor 17 via the IF processor 14 and the detector 15. The audio processor processes only the audio signal of the received broadcasting signal and outputs the processed audio signal through the speaker 19. The video processor 17 processes only the video signal of the received broadcasting signal and outputs the processed video signal to the CRT 18.

If the user pushes a channel number key or a channel increment/decrement key of the key matrix unit 9 or the remote controller 10 to select a desired channel, the microcomputer 12 discriminates whether the key signal is a channel change signal. If the key signal is the channel change signal, the microcomputer 12 outputs a control signal for the change of channel to the tuner 13. Otherwise, if the key signal is not the channel change signal the microcomputer 12 outputs a control signal corresponding to the original channel to the tuner 13.

In this manner, in the conventional television system with the tuning apparatus of the remote control type, the channel selection and change are performed by pushing the channel number key or the channel increment/decrement key of the key matrix unit 9 or the remote controller 10 in accordance with a selection of the user.

As shown in FIG. 2 in the conventional television system with the tuning apparatus of the rotary type, a selection of broadcasting channel signals with different frequencies is performed by the rotation of the mechanical rotary knob 11 by the user. In this case, the tuner 13 includes a plurality of fixed resistors and a plurality of condensers, and a variable condenser for fine tuning the selected channel.

The user can select a broadcasting signal corresponding to a desired channel by rotating the mechanical rotary knob 11. The process of selecting the broadcasting signal is the same as that of the remote control type as mentioned above and the description thereof will thus be omitted.

However, conventional television systems with the tuning apparatus of the rotary type and the remote control type have the following disadvantages.

First, in the conventional television system with the tuning apparatus of the rotary type, the mechanical rotary knob includes a plurality of mechanical contacts, which requires a fair amount of physical strength by the user in order to rotate. Also trouble with the mechanical contacts may occur after a long period of operation. The trouble with the mechanical contacts is malfunction caused by the mechanical rotary knob. Also, because there is a wide difference between natural center frequencies of the VHF and UHF channels, there must be provided separate VHF and UHF channel selectors, resulting in an inconvenience due to separate channel selections.

Second, in the conventional television system with the tuning apparatus of the remote control type, it is inconvenient for some users to memorize all the broadcasting channel numbers in several districts. Also, selecting a desired channel by the channel increment/decrement key requires a large number of repetitions. Further, in the case where the use of the system is complex, some users may have difficulty operating the system.

Third, the conventional television system with the tuning apparatus of the rotary type has another disadvantage, in that its mechanical rotary knob requires a large volume of space, although it is more convenient than that of the remote control type because of simplicity of use in channel selection. The large volume of space needed by the mechanical rotary knob results in a large possessing area within the television system and results in manufacturing complexity. Also, the mechanical rotary knob is expensive.

Fourth, in the conventional television system with the tuning apparatus of the remote control type, there is present one input signal to the microcomputer. For this reason, noise accompanying the input signal results in malfunction of the microcomputer.

SUMMARY OF INVENTION

Therefore, the present invention has been made in view of the above problems, and it is an object of the present invention to provide a tuning apparatus for a television system which is capable of readily changing channels utilizing a channel changing mechanism of the slide rotary type, and a method of controlling the same.

It is another object of the present invention to provide a tuning apparatus for a television system which is capable of preventing a system malfunction due to noise utilizing two signals with a constant phase difference with respect to each other, as channel change signals, and a method of controlling the same.

In accordance with one aspect of the present invention, there is provided a tuning apparatus for a television system, comprising: rotary encoding means, having a slidable and rotatable channel changing mechanism, said rotary encoding means outputting a plurality of signals with a phase difference with respect to one another, corresponding to a channel change and in accordance with a rotation of a channel changing mechanism; control means for calculating a channel number to be changed in accordance with the output signals from said rotary encoding means and outputting channel receive data corresponding to the calculated channel number; and tuning means for receiving a television broadcasting signal of a channel corresponding to the channel receive data from said control means.

In accordance with another aspect of the present invention, there is provided a method of controlling tuning in a television system, comprising the steps of: (a) if a channel is changed by a channel changing mechanism, generating two signals with a phase difference with respect to each other, corresponding to the changed channel; (b) recognizing channel increment direction, channel decrement direction and generation of an error, in accordance with states of the two signals; (c) calculating a new channel number to be changed according to whether the recognized channel change direction is the channel increment direction or the channel decrement direction; and (d) providing a tuner with channel receive data corresponding to the calculated new channel number such that said tuner selects a new channel.

In accordance with still another aspect of the present invention, there is provided a method of controlling tuning in a television system, comprising the steps: (a) if a channel change signal is generated by a channel changing mechanism, performing a channel change corresponding to the current broadcasting mode; (b) if no channel change signal is input and a channel recall signal is generated, performing a recall function of displaying the current channel number in the current broadcasting mode; (c) if no channel change signal is input and a broadcasting mode change signal is generated, changing the current broadcasting mode into a desired broadcasting mode; and (d) performing the channel change corresponding to the changed broadcasting mode in accordance with the input channel change signal and displaying the changed channel number.

In accordance with yet another aspect of the present invention, there is provided a method of controlling tuning in a television system, comprising the steps of: (a) if a channel change signal is generated by a channel changing mechanism, performing a channel change corresponding to the current broadcasting mode; (b) if no channel change signal is input and a signal corresponding to a recall function and broadcasting mode change is generated, setting an operation of a timer; (c) if the operation of said timer is set, counting a period of time during which the signal corresponding to the recall function and broadcasting mode change is input; (d) if the input of the signal corresponding to the recall function and broadcasting mode change is stopped, resetting the operation of said timer; (e) comparing the counted time value of said timer with preset time values; (f) in accordance with the compared result, changing the current broadcasting mode into a desired broadcasting mode and then performing the channel change corresponding to the changed broadcasting mode in accordance with the input channel change signal, or performing the channel recall function in the current broadcasting mode; and (g) displaying a channel number in the changed broadcasting mode or the current channel number in the current broadcasting mode according to execution of the recall function.

Further scope of applicability of the present invention will become apparent from the detailed description given hereinafter. However, it should be understood that the detailed description and specific examples, while indicating preferred embodiments of the invention, are given by way of illustration only, since various changes and modification within the spirit and scope of the invention will become apparent to those skilled in the art from this detailed description.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF PREFERRED EMBODIMENTS

Figure 1:
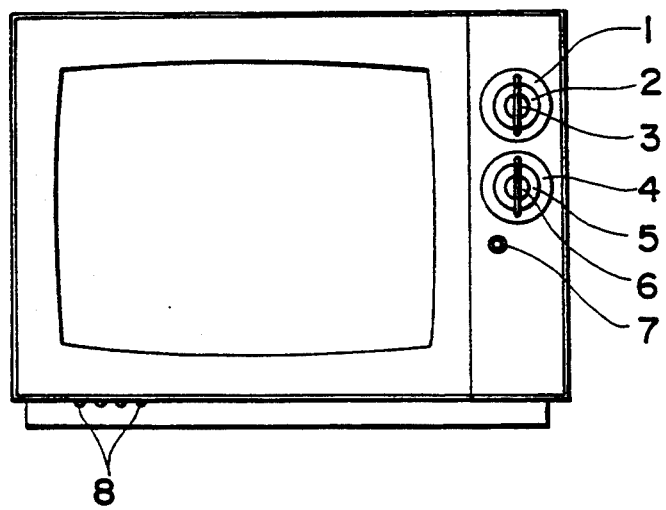
FIG. 1 is a front view of a conventional television set with a tuning apparatus of the rotary type.
Figure 2:
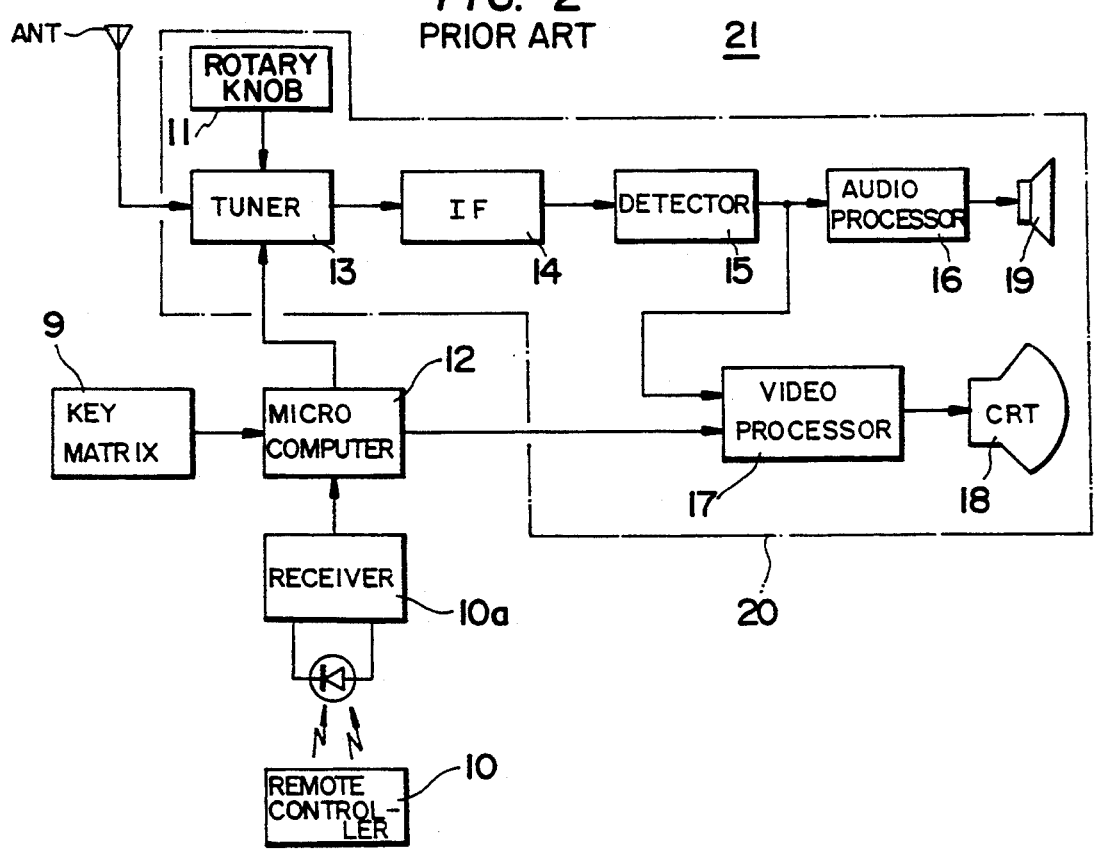
FIG. 2 is a block diagram of a conventional television system with the tuning apparatus of the rotary type and the remote control type.
Figure 3:
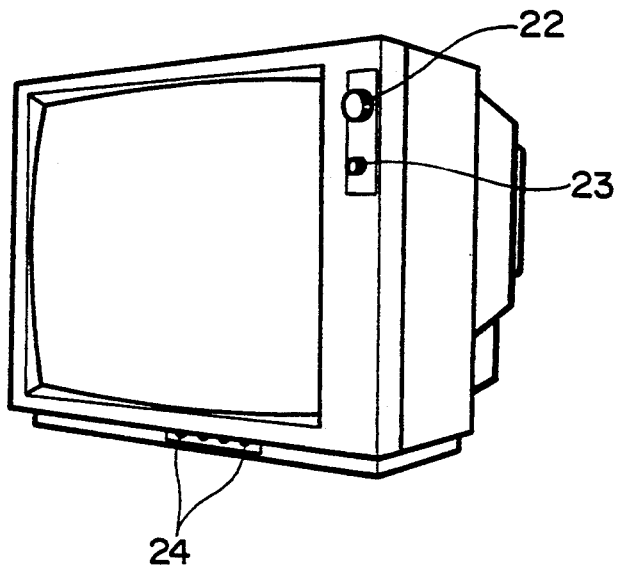
FIG. 3 is a perspective view of a television set with a tuning apparatus utilizing a rotary encoder in accordance with the present invention.

With reference to FIG. 3, there is shown a perspective view of a television set with a tuning apparatus utilizing a rotary encoder in accordance with the present invention. As shown in this drawing, the television set comprises a slide rotary type channel selecting knob 22, a power switch and volume adjusting switch 23 and a control part 24 for controlling color, tint, brightness, and contrast, each being disposed on an external panel.

Figure 4:
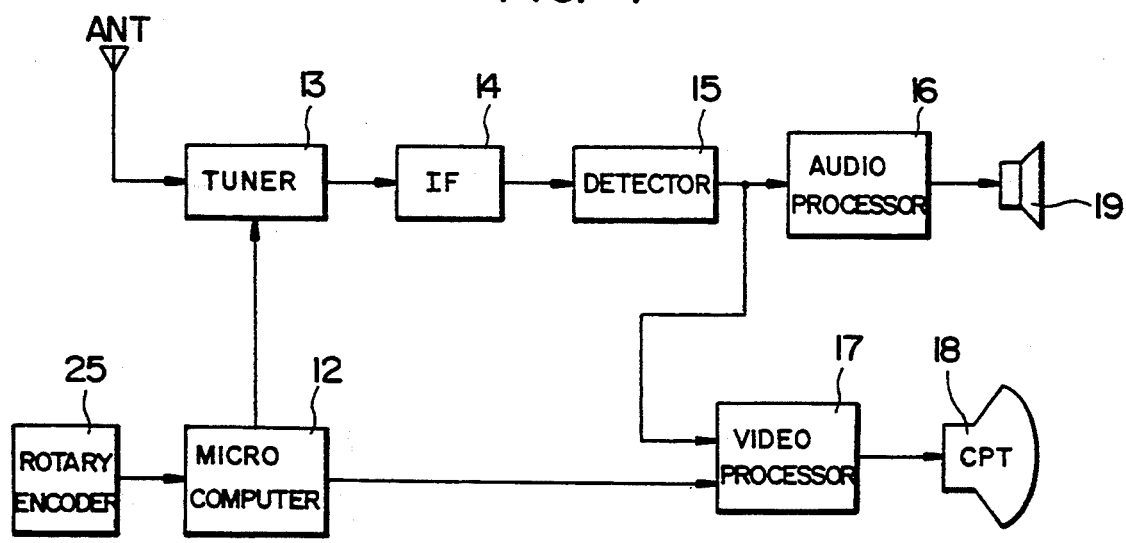
FIG. 4 is a block diagram of a television system with the tuning apparatus utilizing the rotary encoder in accordance with an embodiment of the present invention.

With reference to FIG. 4, there is shown a block diagram of a television system with a tuning apparatus utilizing the rotary encoder in accordance with an embodiment of the present invention. Rotary encoder 25 is employed for the purpose of channel selection and change, instead of the remote controller 10, the remote signal receiver 10a, and the key matrix 9.

Figure 5A:
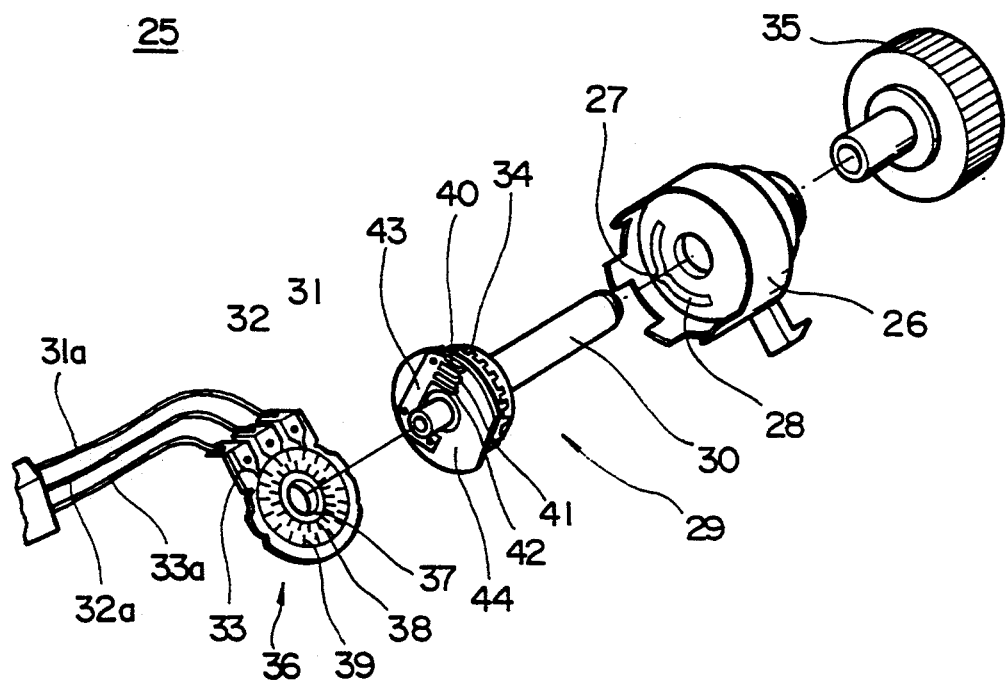
FIG. 5A is a view illustrating a construction of the rotary encoder in accordance with an embodiment of the present invention.
Figure 5B:
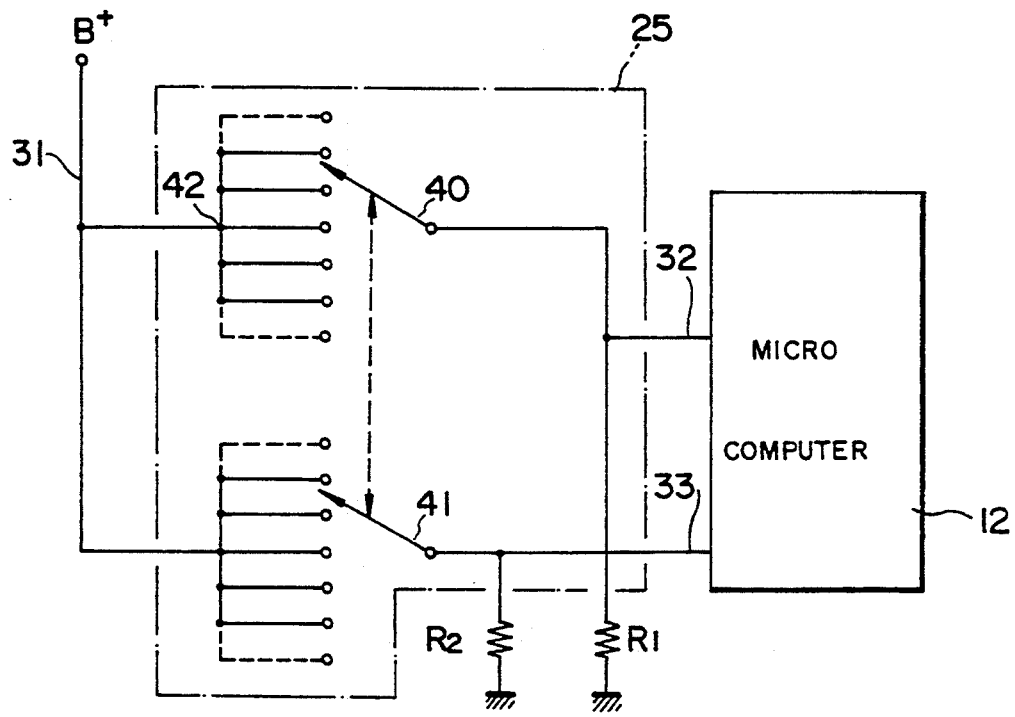
FIG. 5B is a view illustrating an operation of the rotary encoder in accordance with an embodiment of the present invention.

FIGS. 5A and 5B are views illustrating the construction and operation of the rotary encoder 25 in accordance with the embodiment of the present invention, respectively. The rotary encoder 25 comprises three lead terminals 31, 32 and 33, one of which is connected to a power source B+ and the other terminals of which are connected to the microcomputer 12 in FIG. 4 and are also connected to the ground via resistors R1 and R2, respectively. On a bracket 26 is formed a semicircular slitted copper plate 28 with a round protrusion 27. A shaft assembly 29 is provided with a shaft 30 and teeth 34 for guiding the round protrusion 27. The bracket 26 receives the shaft 30 by means of a center hole thereof and also receive a hollow shaft of a channel selecting knob 35 at the opposite end thereof to the shaft 30 in order to engage the channel selecting knob 35 with the free end of the shaft 30 by virtue of a conventional engaging mechanism, thereby causing the shaft 30 to rotate as the channel selecting knob 35 rotates. Also, the shaft assembly 29 is provided with a circular disk on which a slitted iron member 43 is mounted, the slitted iron member 43 having a plurality of resilient slit terminals 40, 41 and 42 integrally formed at an end thereof. The slit terminals 40, 41 and 42 are adapted respectively to contact with printed patterns 37, 38 and 39 on a printed circuit board 36 when the shaft 30 rotates, as the user turns the channel selecting knob 35, in order to generate channel change signals.

Herein, the slit terminals 40 and 41 in FIG. 5A function as interlocking switches as shown in FIG. 5B. Also, the slit terminal 42 is connected to the power source B+. Namely, the slit terminals 40 and 41 function as switches for generating trigger pulses with a phase difference with respect to each other. Each of the terminals with which the slit terminals 40 and 41 contact is a printed pattern on the printed circuit board 36.

Figure 6:
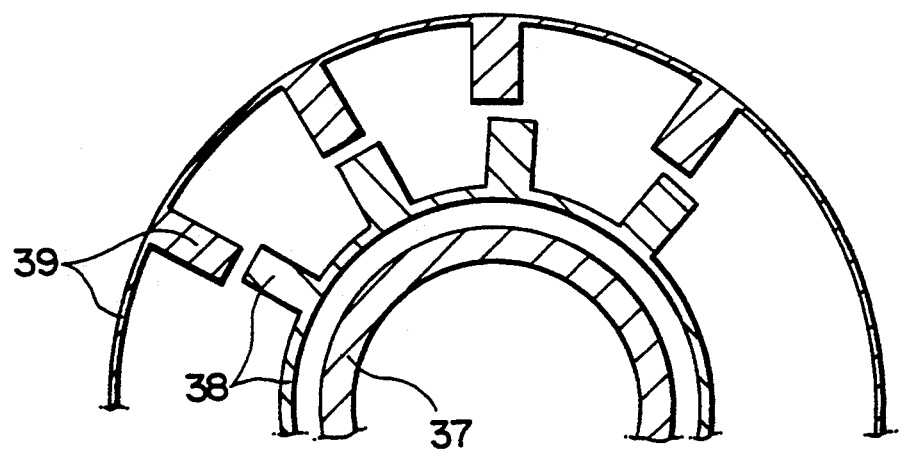
FIG. 6 is an enlarged view of a printed circuit board in FIG. 5A.
Figure 7:
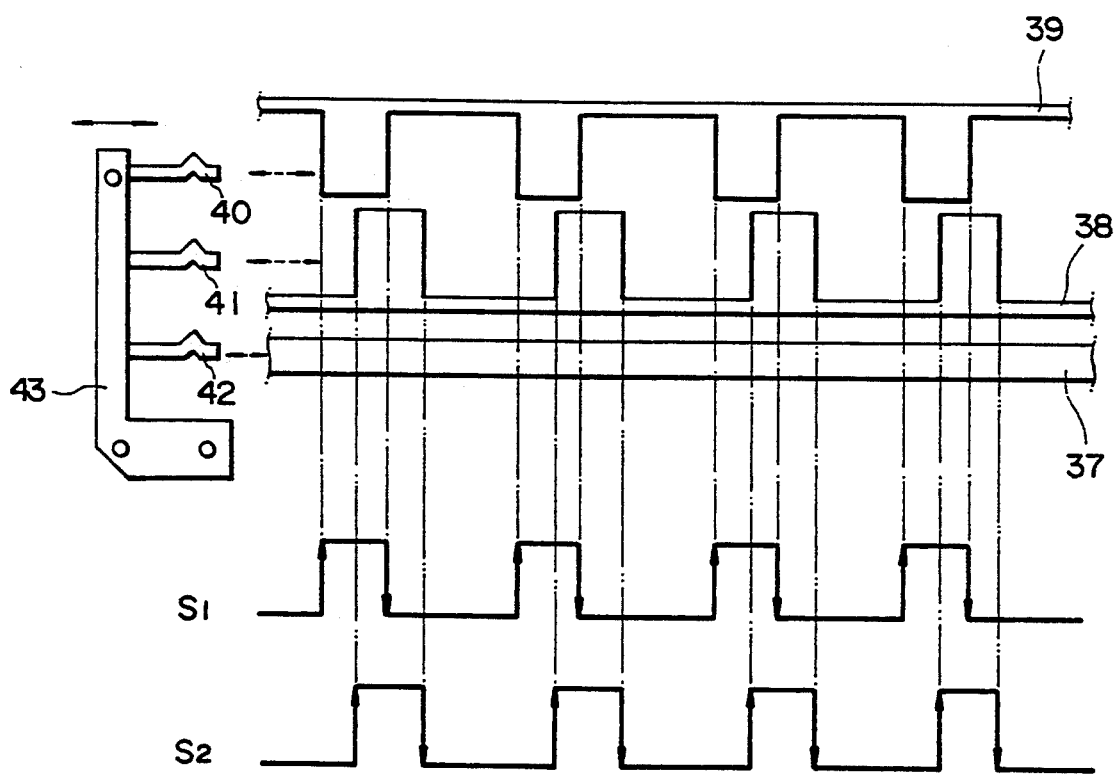
FIG. 7 is a view illustrating a state wherein channel change signals are generated from the rotary encoder in accordance with the present invention.

FIG. 6 is an enlarged view of the printed circuit board 36 in FIG. 5A, in which the reference numerals 37, 38 and 39 designate the printed patterns on the printed circuit board 36, respectively With reference to FIG. 7, there are shown positioned conditions of the slit terminals 40, 41 and 42 on the slitted iron member 43 and the patterns 37, 38 and 39 on the printed circuit board 36 as the rotation of the channel selecting knob 35 in FIG. 5A and a relationship between trigger signals being applied to the microcomputer 12 through lead wires 31a, 32a and 33a in accordance with the positioned conditions. When the slit terminal 40 contacts with the pattern 39, the applied trigger signal is high; when the slit terminal 40 is separated from the pattern 39, the applied trigger signal is low. Also, when the slit terminal 41 contacts with the pattern 38, the applied trigger signal is high; when the slit terminal 41 is separated from the pattern 38, the applied trigger signal is low. As a result, FIG. 7 illustrates a state wherein two trigger pulse signals from the rotary encoder 25 are applied to the microcomputer 12, with the signals having a phase difference with respect to each other.

Now, the operation of the rotary encoder 25 will be described.

First, if the user turns the channel selecting knob 35, the shaft 30 of the shaft assembly 29 rotates. As shaft 30 rotates, the teeth 34 rotate such that they resiliently engage with the round protrusion 27 on the bracket 29. Simultaneously, the resilient slit terminals 40, 41 and 42 on the slitted iron member 43 contact with the printed patterns 37, 38 and 39 on the printed circuit board 36, respectively, in order to generate the trigger signals.

That is, if the user turns the channel selecting knob 35 to select a desired channel, the slitted iron member 43 moves on the printed circuit board 36. Namely, the slit terminal 40 of the slitted iron member 43 moves on the pattern 39 of the printed circuit board 36, the slit terminal 41 moves on the pattern 38, and the slit terminal 42 moves on the pattern 37. As shown in FIG. 5B, the pattern 37 is connected to the power source B+ through the lead terminal 31 and the patterns 38 and 39 are connected to the resistors R1 and R2 through the lead terminals 32 and 33, thereby enabling the two trigger pulse signals to be applied to the microcomputer 12.

In accordance with the preferred embodiment of the present invention, the two trigger signals with a constant phase difference with respect to each other, as channel change signals, are applied to the microcomputer 12, in order to prevent a system malfunction due to noise which occurs when a single trigger signal, as a channel change signal, is applied to the microcomputer 12.

Figure 8:
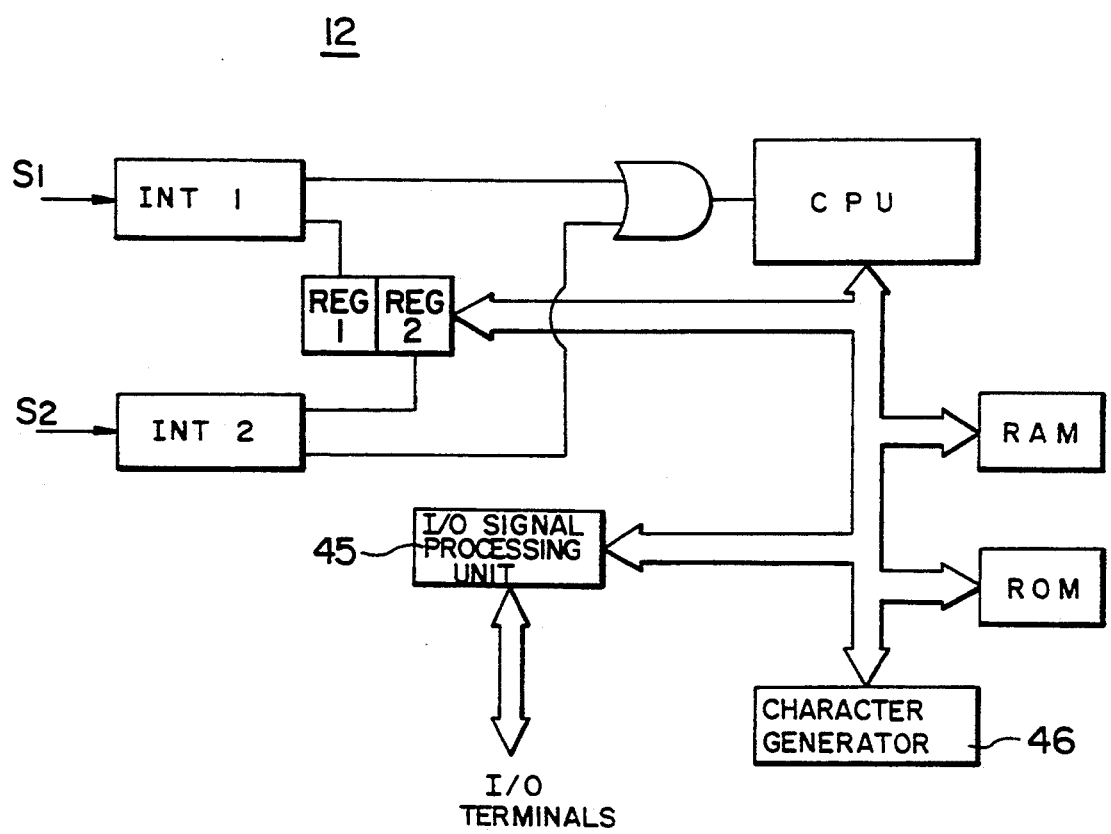
FIG. 8 is a block diagram of a microcomputer in FIG. 4 in accordance with the present invention.

With reference to FIG. 8, there is shown a block diagram of the microcomputer 12 in FIG. 4. As shown in this drawing, the microcomputer 12 comprises interrupt terminals INT1 and INT2 for receiving two external interrupt signals, registers REG1 and REG2 for temporarily storing states of the two external interrupt signals, a central processing unit CPU, a random access memory RAM, a read only memory ROM, an input/output signal processing unit 45 and a character generator 46.

The operation of the microcomputer 12 will now be described.

First, the CPU reads data stored in the ROM to perform a main program. Upon receiving the external interrupt signals during execution of the main program, the CPU jumps to an interrupt processing routine. Then, upon completion of the interrupt processing routine, the operation of the CPU returns to the main program.

Also, if a desired key signal is inputted through an input/output terminal, the CPU reads character font data in the ROM and outputs the read data to the character generator 46, in order to display a state corresponding to the inputted key signal. The character font data to be displayed by the character generator 46 is previously stored in the ROM by a programmer.

Figure 9:
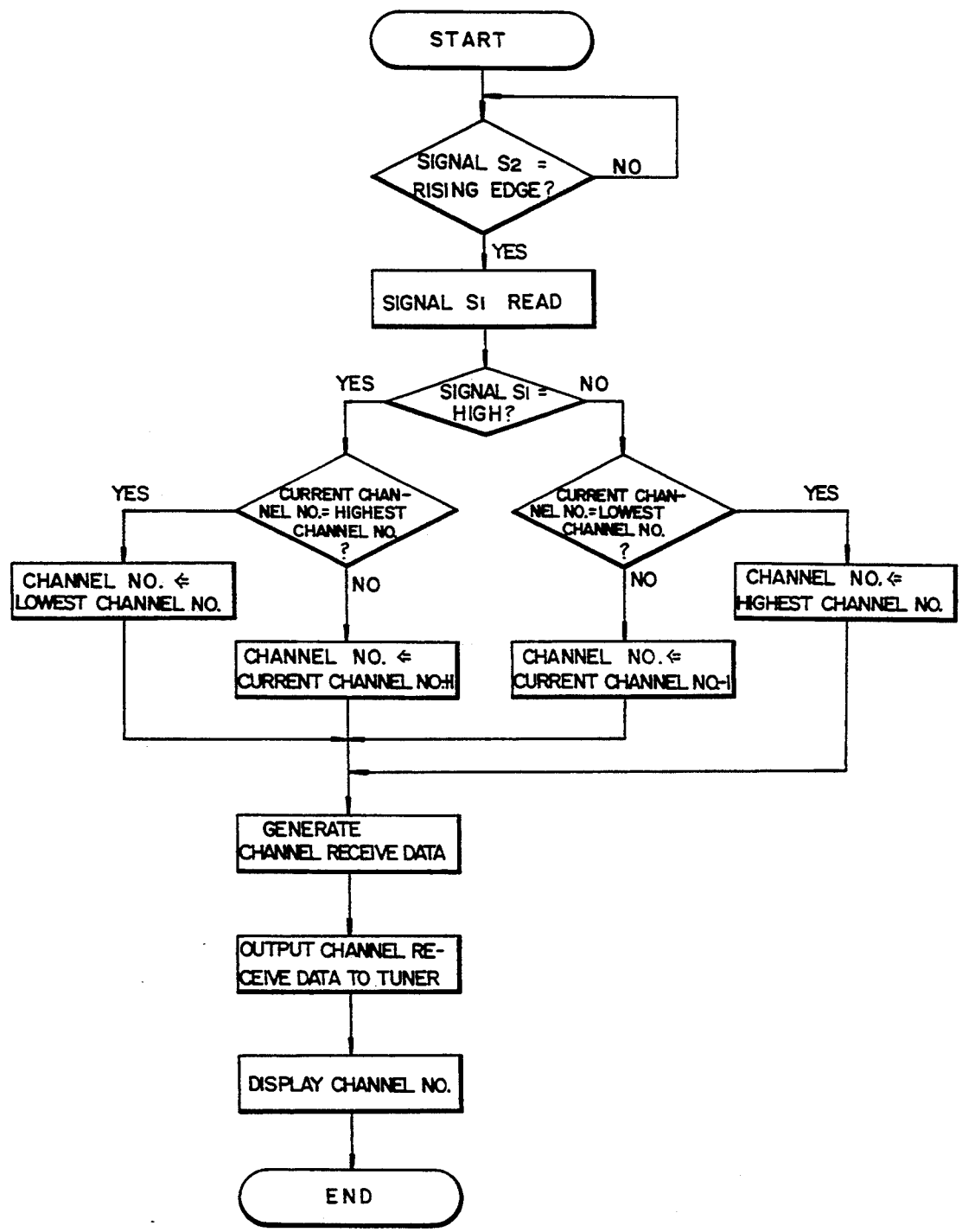
FIG. 9, 10A and 10B are flowcharts illustrating the operation of the tuning apparatus in accordance with the embodiment of the present invention.
Figure 10:
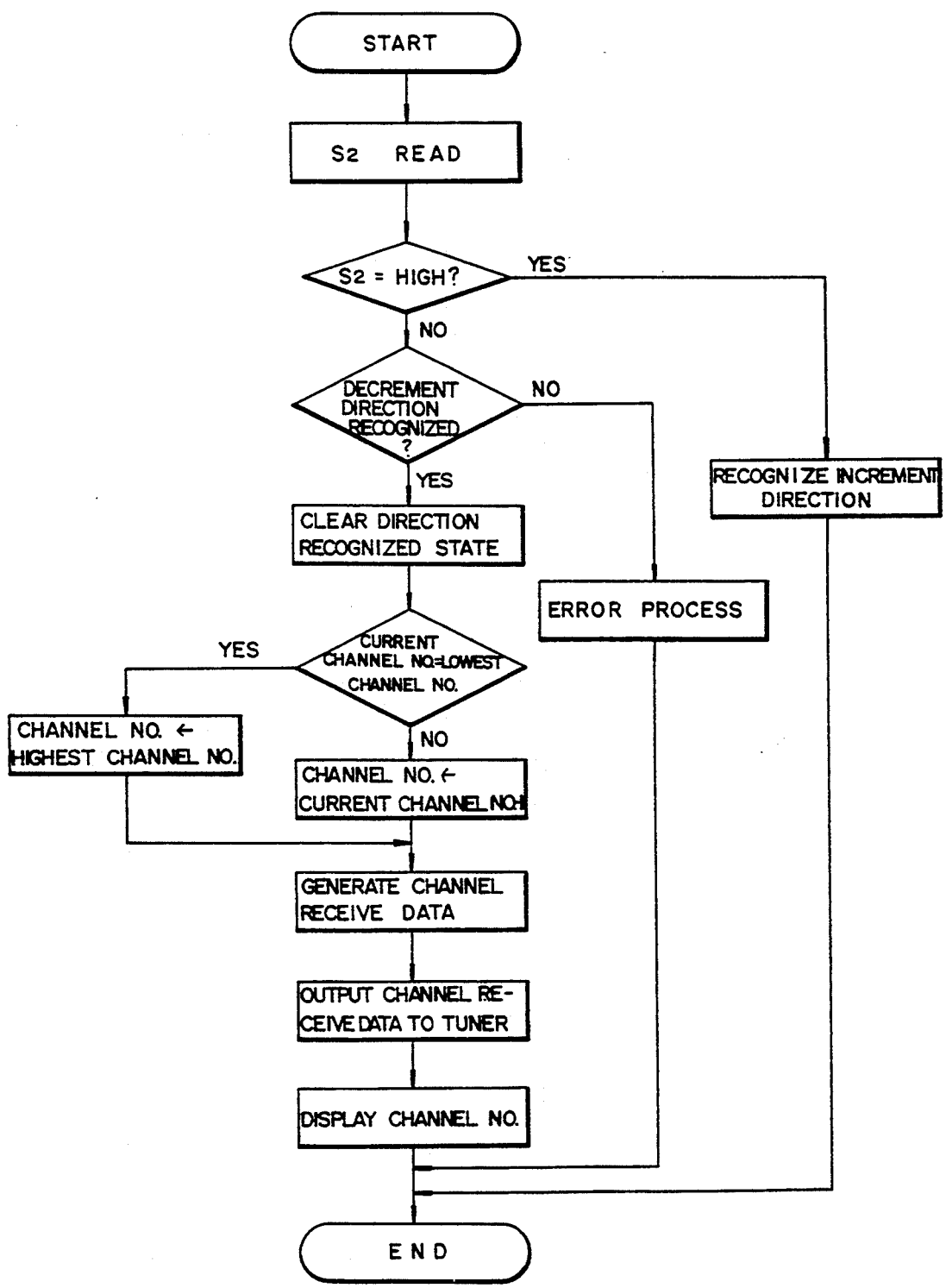
Figure 10B:
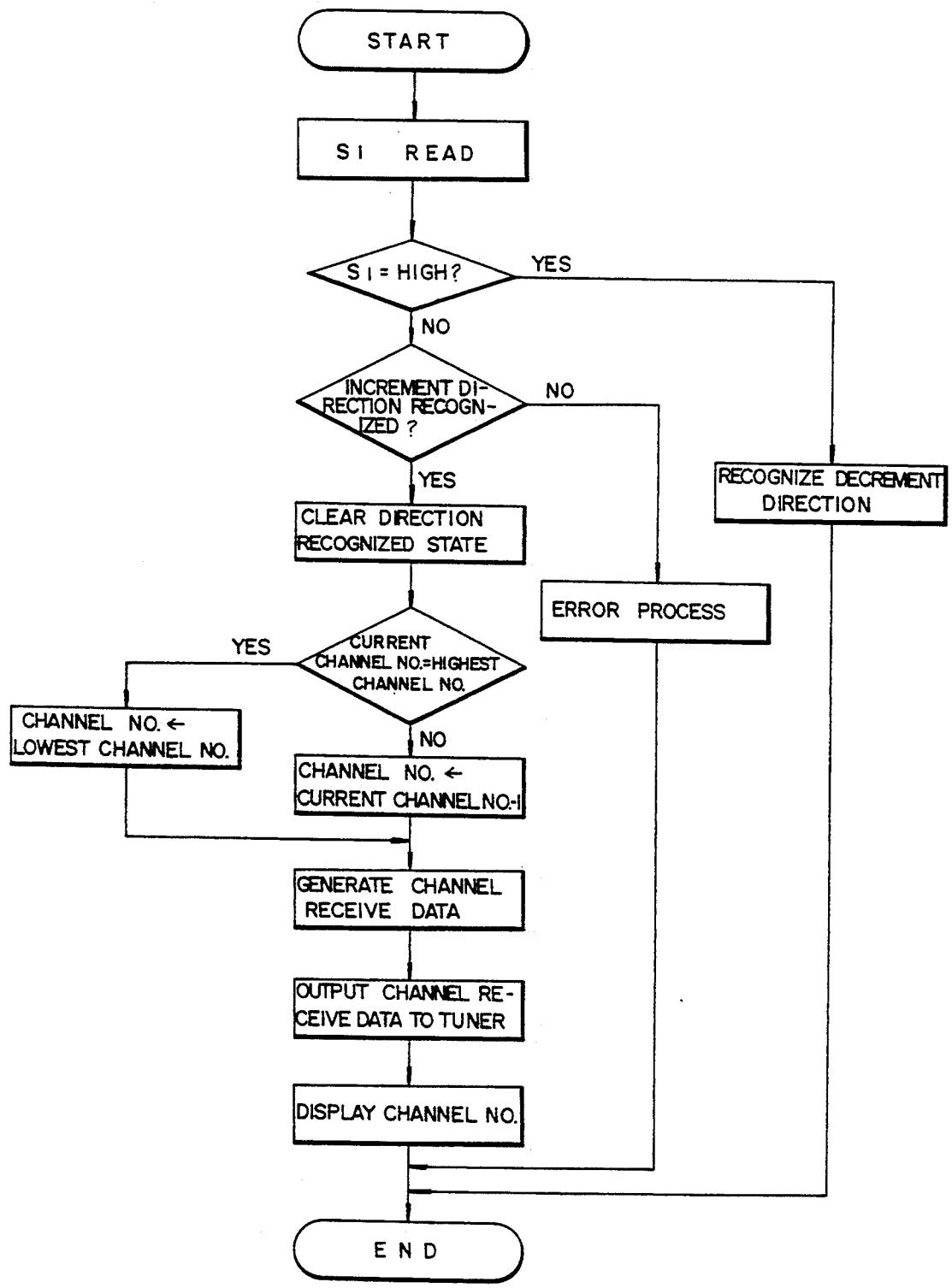

Now, the operation of the tuning apparatus in accordance with the embodiment of the present invention will be described in detail with reference to FIGS. 9, 10A and 10B.

First, the operation of the tuning apparatus in accordance with the embodiment of the present invention will be described with reference to FIG. 9.

Under the condition that one channel change signal is triggered and thus interrupted at its rising edge, the operation is in a channel increment mode if the other channel change signal is high and in a channel decrement mode if the other channel change signal is low. That is, if the channel change signal S2 is applied as an interrupt signal to the interrupt terminal INT2 in FIG. 8 and the channel change signal S1 is high, the microcomputer 12 operates in the channel increment mode and checks whether the current channel number is the highest channel number. If the current channel number is the highest channel number, the microcomputer 12 changes the current channel number to the lowest channel number because no further channel number increment can be performed. Otherwise, if the current channel number is not the highest channel number, the microcomputer 12 increments the current channel number by one and outputs tuning data corresponding to the incremented channel number to the tuner 13 shown in FIG. 4. Simultaneously, the microcomputer 12 displays the incremented channel number via the character generator 46 in order to inform the user of the selected channel.

Further, if the channel change signal S2 is triggered and thus interrupted at its rising edge or falling edge and the channel change signal S1 is low, the microcomputer 12 operates in the channel decrement mode and checks whether the current channel number is the lowest channel number. If the current channel number is the lowest channel number, the microcomputer 12 changes the current channel number into the highest channel number because no further channel number decrement can be performed. Otherwise, if the current channel number is not the lowest channel number, the microcomputer 12 decrements the current channel number by one. The subsequent operation of the microcomputer 12 is the same as that in the channel increment mode and the description thereof will thus be omitted.

Figure 11:
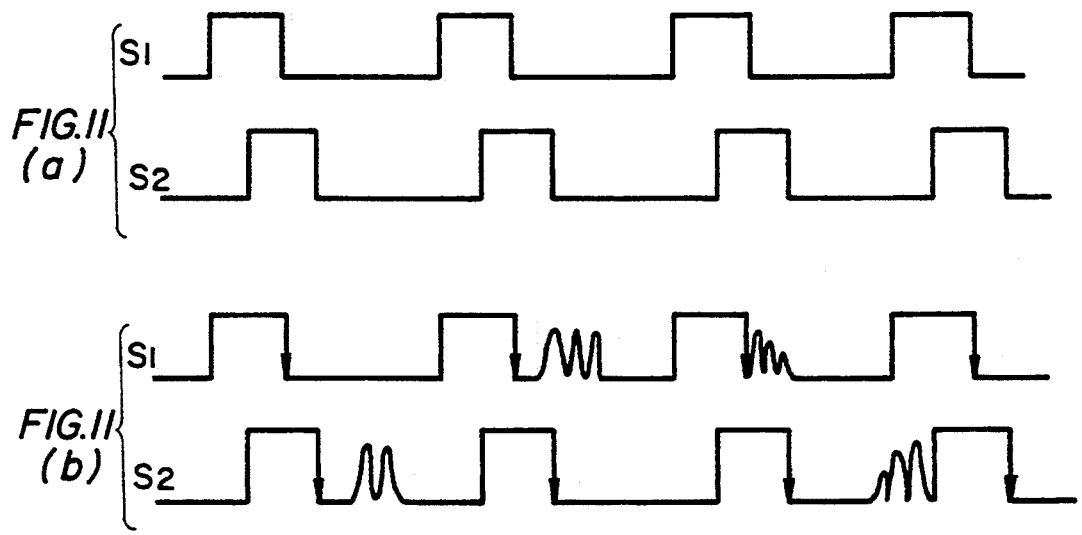
FIG. 11A is a waveform diagram of trigger signals being input to the microcomputer.
FIG. 11B is a waveform diagram of the trigger signals being input to the microcomputer, with noises being included therein.

In the operation described with reference to FIG. 9, only one of the channel change signals S1 and S2 is employed as an interrupt signal. However, a malfunction of the microcomputer 12 may occur due to noise, as shown in FIG. 11B, which may be included in the two trigger signals as the channel change signals being outputted from the rotary encoder 25 as shown in FIG. 11A, or chattering noise which may occur in the change of channels. For the purpose of preventing the malfunction of the microcomputer 12, it is preferred to process both of the channel change signals S1 and S2 with a constant phase difference with respect to each other at the interrupt terminals INT1 and INT2 of the microcomputer 12. This operation of processing both of the channel change signals S1 and S2 at the interrupt terminals INT1 and INT2 of the microcomputer 12 will hereinafter be described with reference to FIGS. 10A and 10B.

First, if the channel change signal S1 is triggered and thus interrupted at its rising edge or falling edge, the microcomputer 12 reads a state of the channel change signal S2 being applied to interrupt terminal INT2 at that time. If the channel change signal S2 is high, the microcomputer 12 recognizes the channel increment direction and then completes the current routine. Otherwise, if the channel change signal S2 is low, the microcomputer 12 checks whether the channel decrement direction has ben recognized. If the channel decrement direction has been recognized, the microcomputer 12 decrements the current channel number by one. Unless the channel decrement direction has been recognized, the microcomputer 12 regards the channel change signal S2 as a noise signal and performs an error process and then completes the current routine.

Further, if the channel change signal S2 is triggered and thus interrupted at its rising edge or falling edge, the microcomputer 12 reads a state of the channel change signal S1 being applied to the interrupt terminal INT1 at that time. If the channel change signal S1 is high, the microcomputer 12 recognizes the channel decrement direction and then completes the current routine. Otherwise, if the channel change signal S1 is low, the microcomputer 12 checks whether the channel increment direction has been recognized. If the channel increment direction has been recognized, the microcomputer 12 increments the current channel number by one. Unless the channel increment direction has been recognized, the microcomputer 12 regards the channel change signal S1 as a noise signal and performs an error process and then completes the current routine.

Accordingly, a malfunction of the microcomputer 12 due to noise as shown in FIG. 11B can be prevented even if the noise is included in the two trigger signals as the channel change signals being outputted from the rotary encoder 25 as shown in FIG. 11A. The subsequent operation of the microcomputer 12 is the same as that described with reference to FIG. 9, beginning with checking whether the current channel number is the highest channel number or the lowest channel number, and the description thereof will thus be omitted.

Figure 12:
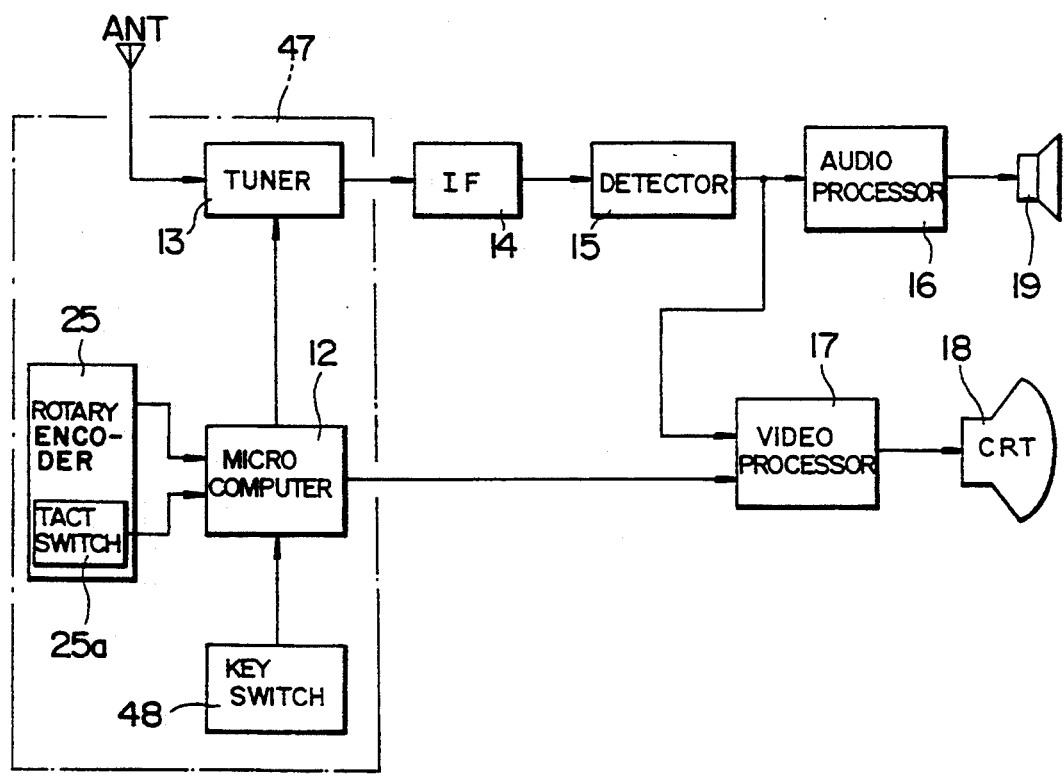
FIG. 12 is a block diagram of the television system with the tuning apparatus utilizing the rotary encoder in accordance with an alternative embodiment of the present invention.

With reference to FIG. 12, there is shown a block diagram of the television system with the tuning apparatus utilizing the rotary encoder in accordance with an alternative embodiment of the present invention. The construction in this drawing is substantially the same as that in FIG. 4, with the exception that the rotary encoder 25 is provided with a tact switch 25a and a key switch 48 is additionally provided on the external panel of the television set, so that output signals therefrom can be applied to the microcomputer 12 in accordance with a selection by the user. Herein, the reference numeral 47 designates the tuning apparatus in accordance with the alternative embodiment of the present invention.

Figure 13A:
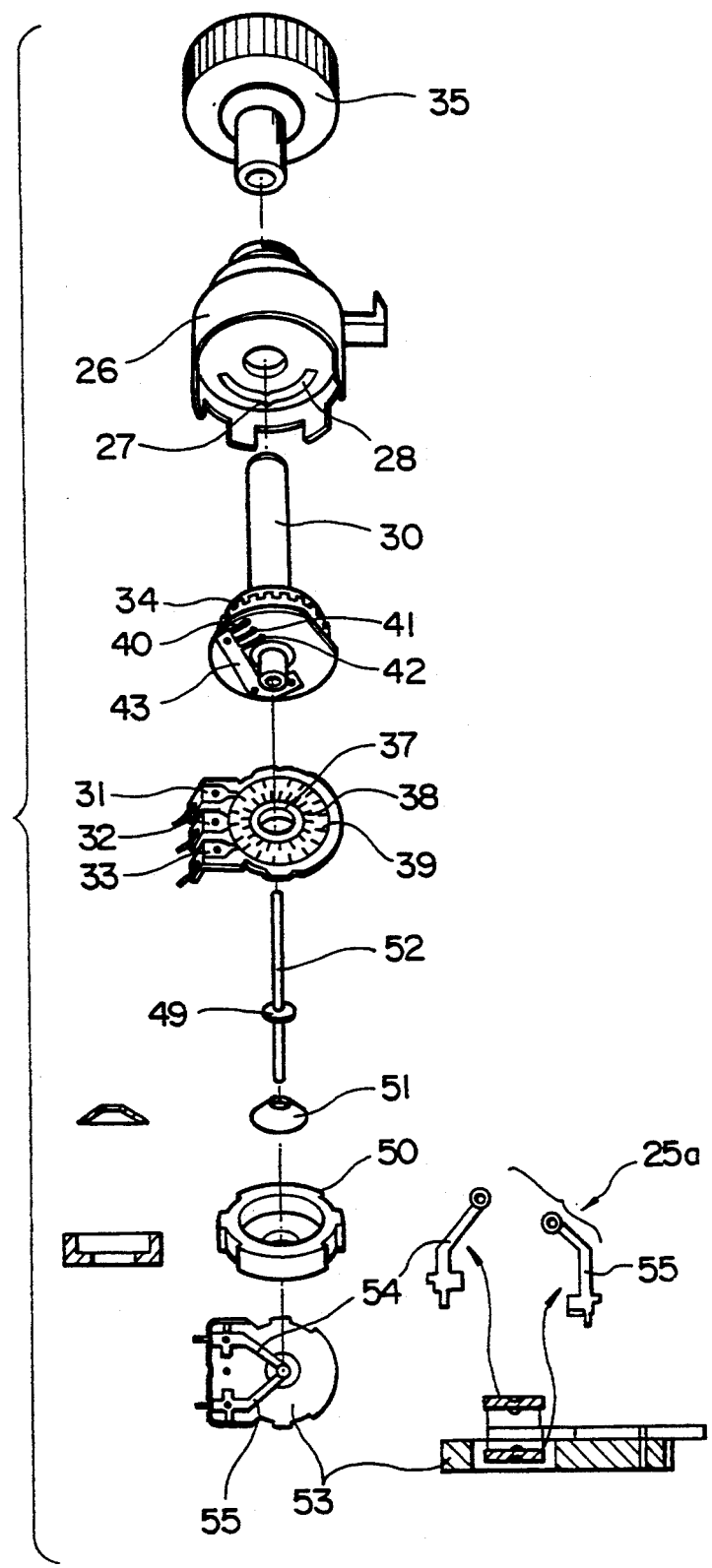
FIG. 13A is a view illustrating a construction of the rotary encoder in accordance with an alternative embodiment of the present invention.

With reference to FIG. 13A, there is shown a view illustrating a construction of the rotary encoder 25 which is provided with the tact switch 25a in accordance with the alternative embodiment of the present invention.

The operation of the rotary encoder 25 will now be mentioned with reference to FIG. 13A.

If the user pushes the slide rotary type channel selecting knob 35, a dish spring 51 is compressed by a dish spring holder 50 and a protrusion 49, thereby causing a tact switch shaft 52 to contact resilient tact terminals 54 and 55 with each other, the resilient tact terminals 54 and 55 being fixed to a tact terminal 53 and spaced apart from each other.

Further, if the user releases his or her pushing of the channel selecting knob 35, the tact switch shaft 52 becomes more distant from the dish spring holder 50 by a resilience of the dish spring 51, thereby causing the tact terminals 54 and 55 to be separated from each other. The description of the additional components are the same as with reference to FIG. 5A, and will thus be omitted.

Next, the operation of the rotary encoder 25 will be described with reference to FIG. 13B which is an equivalent circuit diagram of the rotary encoder shown in FIG. 13A.

Figure 13B:
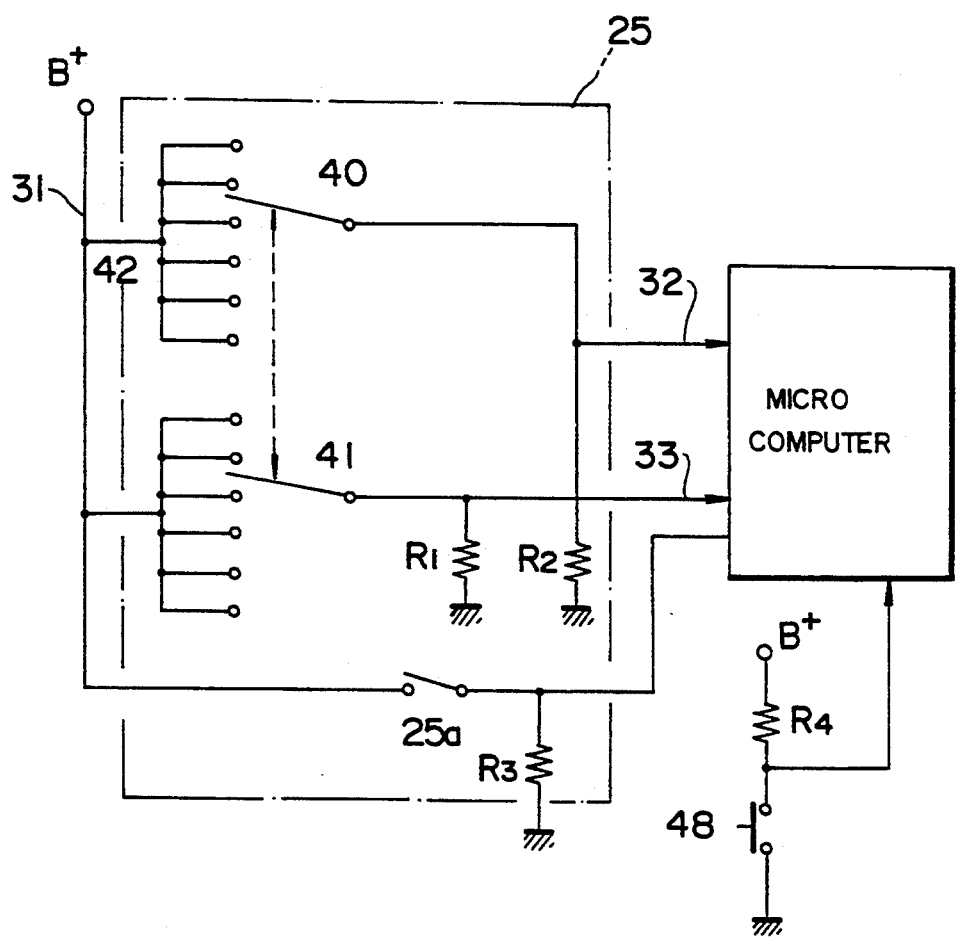
FIG. 13B is a view illustrating an operation of the rotary encoder in accordance with an alternative embodiment of the present invention.

If the channel selecting knob 35 is pushed, the tact terminals 54 and 55 in FIG. 13A are shorted, thereby causing the power from the power source B+ to be applied to the microcomputer 12 as shown in FIG. 13B. On the other hand, if pushing of the channel selecting knob 35 is released, the tact terminals 54 and 55 are open, thereby causing the power from the power source B+ not to be applied to the microcomputer 12.

In FIGS. 12 and 13B, the key switch 48 is a multi-function switch which is provided on the external panel of the television set.

Now, the operation of the tuning apparatus in accordance with the alternative embodiment of the present invention will be described in detail with reference to FIGS. 14, 15A, 15B and 16.

Figure 14:
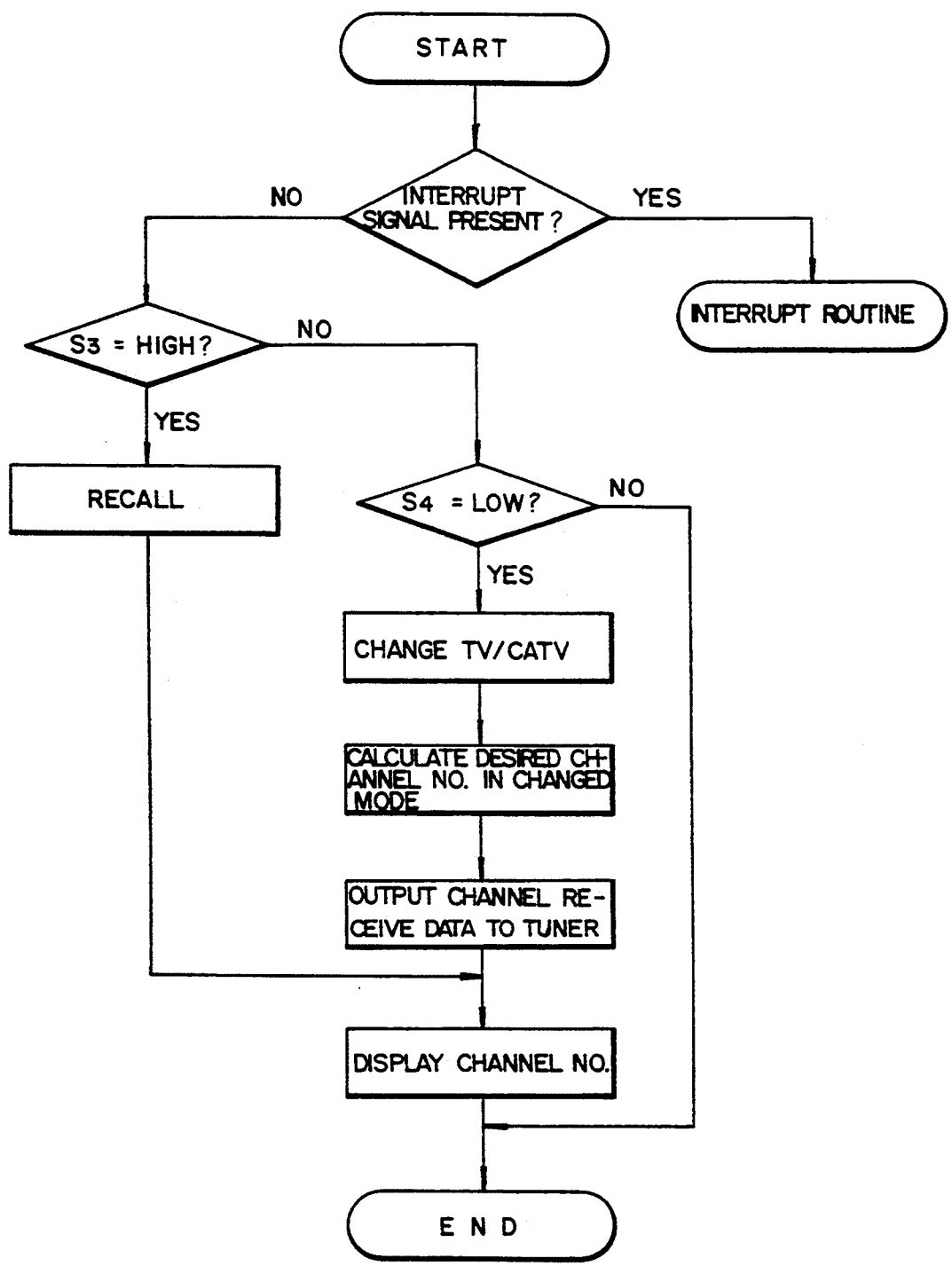
FIGS. 14, 15A, 15B and 16 are flowcharts illustrating the operation of the tuning apparatus in accordance with the alternative embodiment of the present invention.
Figure 15A:
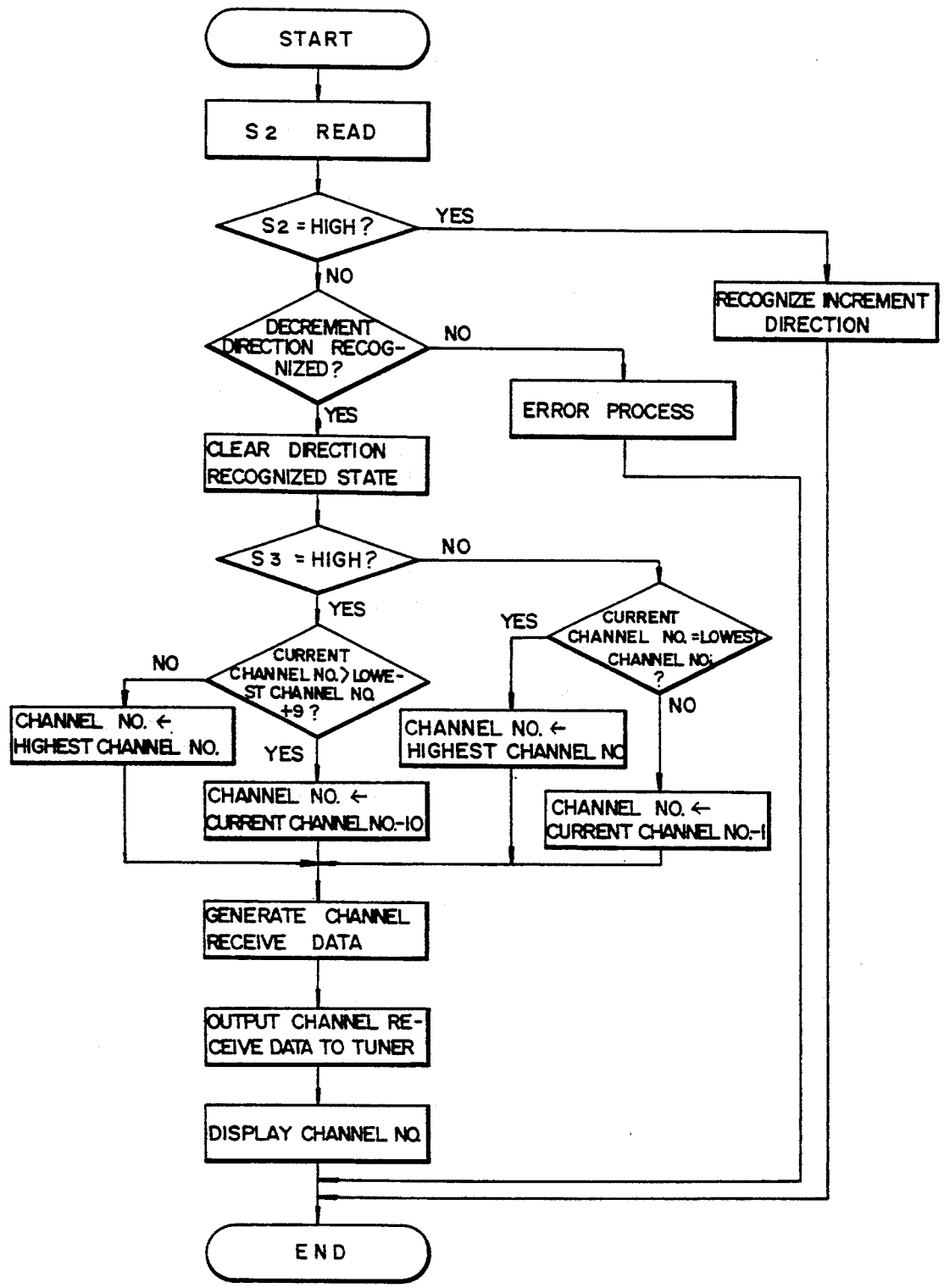
Figure 15B:
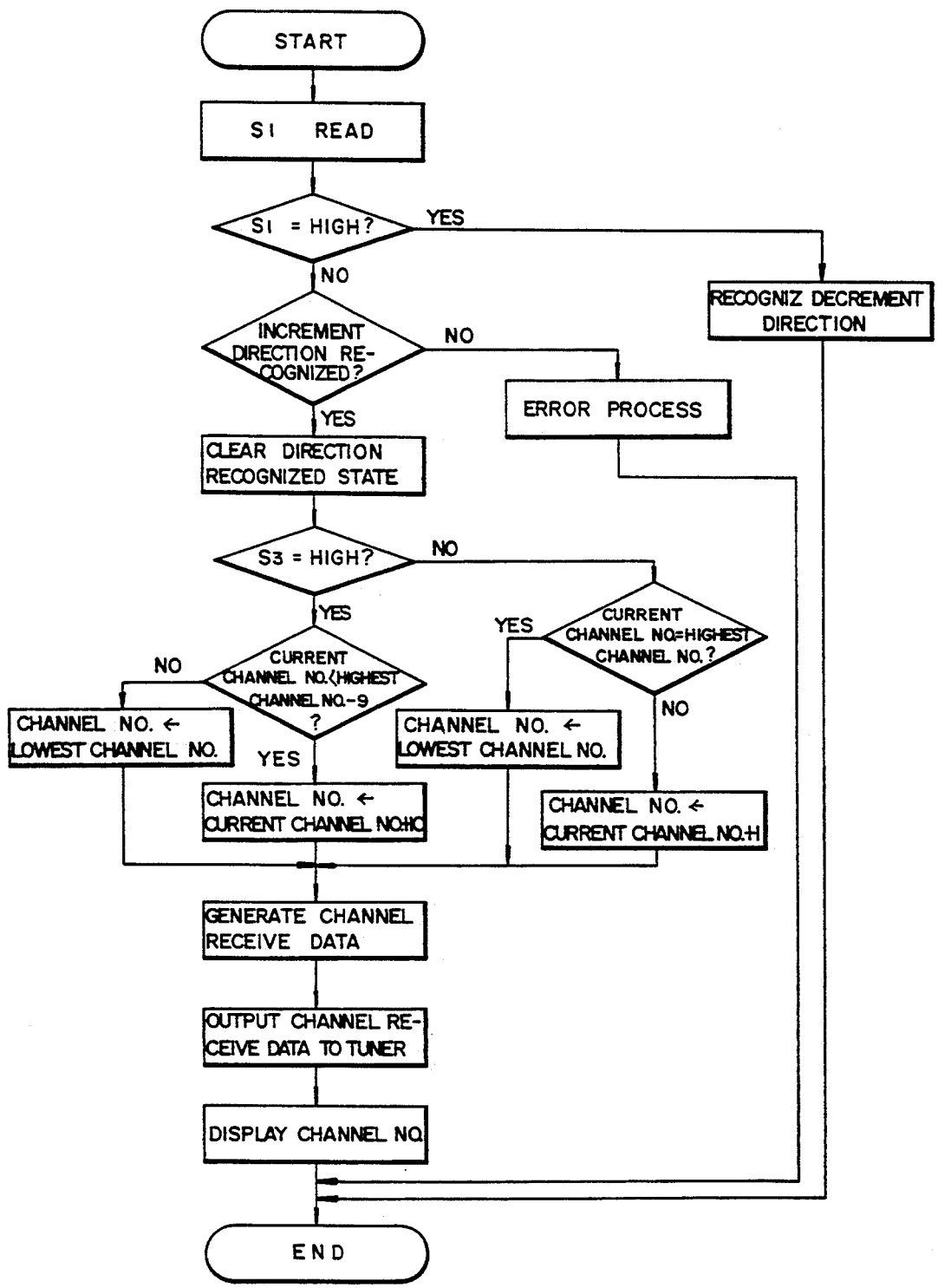
Figure 16:
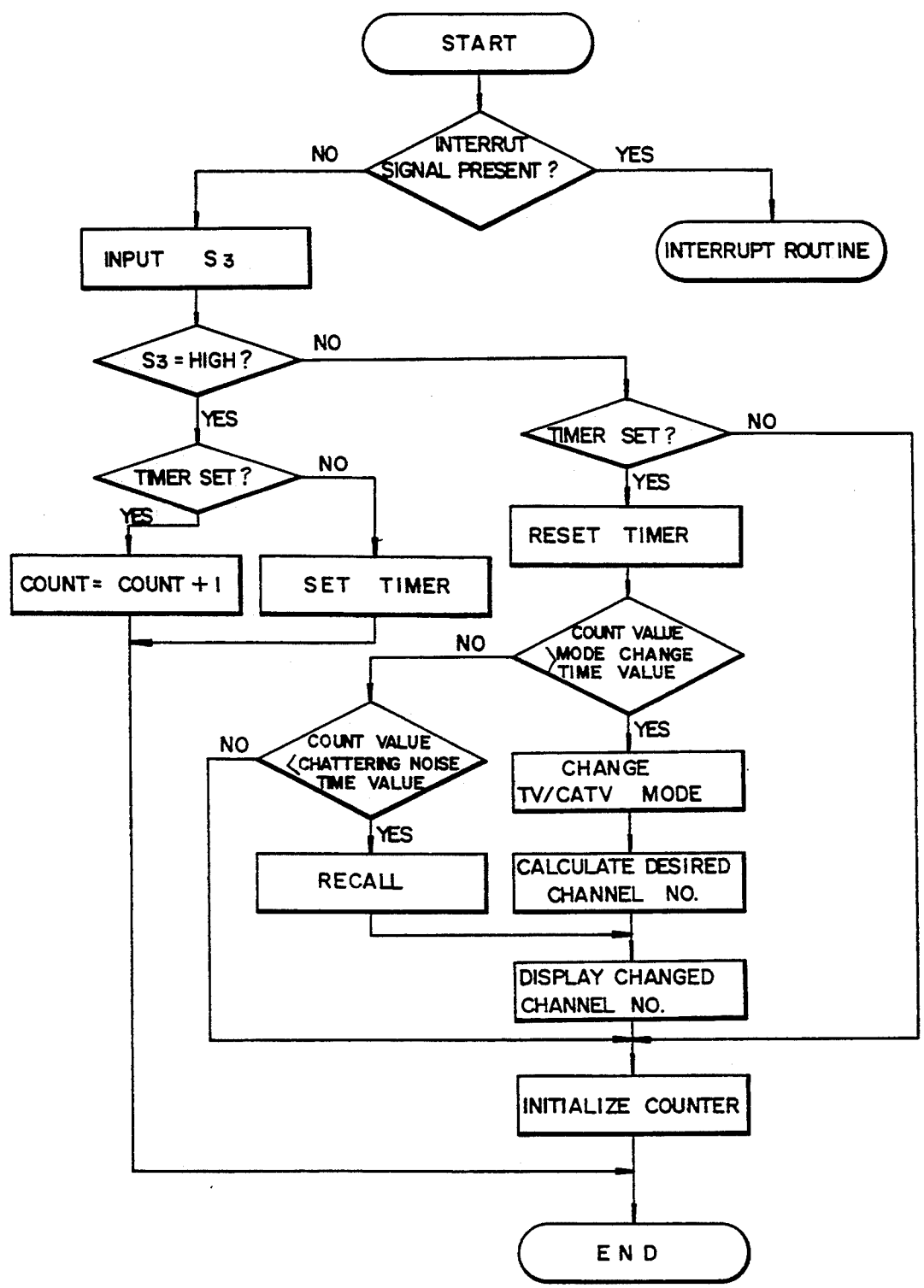

First, in FIG. 14, upon generation of an interrupt by a channel change signal during execution of the main routine, the microcomputer 12 performs an interrupt routine as shown in FIGS. 15A and 15B to be described later.

Further, upon generation of no interrupt and pushing of the channel selecting knob 35 in FIG. 13A, the tact switch 25a in FIGS. 12, 13A and 13B is turned on and thus a high signal S3 is outputted therefrom. The microcomputer 12 checks a state of the signal S3. If the signal S3 is high, the microcomputer 12 performs a channel recall function by displaying the current channel number to inform the user of the current channel number, and then completes the routine. Otherwise, if the signal S3 is low, the microcomputer 12 checks a state of a signal S4 being outputted from the key switch 48 in FIGS. 12 and 13B.

If the signal S4 is high, i.e., if the key switch 48 is off as shown in FIG. 13B, the microcomputer 12 completes the routine. If the signal S4 if low, i.e., if the keyswitch 48 is on as shown in FIG. 13B, the microcomputer 12 changes a television broadcasting mode into a cable television (CATV) broadcasting mode and vice versa. Then, the microcomputer 12 calculates a desired channel number according to the subsequently inputted channel change signal, outputs phase locked loop (PLL) data corresponding to the calculated channel number to the tuner 13 in FIG. 12 and displays the changed channel number. Then, the microcomputer 12 performs the channel change in the changed broadcasting mode.

As mentioned, if the user turns the channel selecting knob 35 in FIG. 13A under the condition that he or she pushes the channel selecting knob 35, or the tact switch 25a in FIG. 13B, there is generated an interrupt to the microcomputer 12. As a result, the microcomputer 12 performs the interrupt routine as shown in FIGS. 15A and 15B.

First, in a case where the user turns the channel selecting knob 35 in the channel increment direction under the condition that he or she pushes the channel selecting knob 35 as shown in FIG. 15A, if one of the channel change signals S1 and S2 being outputted from the rotary encoder 25, i.e., the channel change signal S1 is applied as interrupt signal to the microcomputer 12, the microcomputer 12 checks a state of the other channel change signal, or the channel change signal S2. At this time, since the channel change signal S2 is high, the microcomputer 12 completes the routine, only with recognition of the channel increment direction.

Then, upon being interrupted by the channel change signal S2, the microcomputer 12 checks a state of the channel change signal S1. At this time, since the channel change signal S1 is low, the microcomputer 12 checks whether the channel increment direction has been recognized. Since the channel increment direction has previously been recognized as mentioned above, the microcomputer 12 clears the direction recognized state and then checks a state of the signal S3 outputted from the tact switch 25a provided on the rotary encoder 25. At this time, since the user has turned the channel selecting knob 35 in the channel increment direction under the condition that he or she has pushed the channel selecting knob 35, the tact switch 25a is in an on state. For this reason, the signal S3 from the tact switch 25a is high. As a result, the microcomputer 12 checks whether the current channel number is lower than a value obtained by subtracting nine from the highest channel number. If the current channel number is lower than the value obtained by subtracting nine from the highest channel number, ten is added to the current channel number. If the current channel number is equal to or greater than the value obtained by subtracting nine from the highest channel number, the microcomputer 12 changes the current channel number into the lowest channel number. Then, the microcomputer 12 outputs tuning data corresponding to the changed channel number to the tuner 13 in FIG. 4. Simultaneously, the microcomputer 12 displays the changed channel number through a display (not shown) and then completes the routine.

At this time, under the condition that the channel selecting knob 35 is not pushed, i.e., the tact switch 25a is in an off state, the microcomputer 12 performs the same operation as that described with reference to FIG. 10A. As a result, the channel number is incremented by ten.

Further, as shown in FIG. 15B, if the user turns the channel selecting knob 35 in the channel decrement direction under the condition that he or she pushes the channel selecting knob 35, the channel change signal S2 is first applied as interrupt signal to the microcomputer 12. As a result, the microcomputer 12 checks a state of the other channel change signal, channel change signal S1. At this time, since the channel change signal S1 is high, the microcomputer 12 completes the routine, only with recognition of the channel decrement direction.

Then, upon being interrupted by the channel change signal S1, the microcomputer 12 checks a state of the channel change signal S2. At this time, since the channel change signal S2 is low, the microcomputer 12 checks whether the channel decrement direction has been recognized. Since the channel decrement direction has previously been recognized as mentioned above, the microcomputer 12 clears the direction recognized state and then checks a state of the signal S3 outputted from the tact switch 25a provided on the rotary encoder 25. At this time, since the user has turned the channel selecting knob 35 in the channel decrement direction under the condition that he or she has pushed the channel selecting knob 35, the tact switch 25a is in an on state. For this reason the signal S3 from the tact switch 25a is high. As a result, the microcomputer 12 checks whether the current channel number is greater than a value obtained by adding nine to the lowest channel number. If the current channel number is higher than the value obtained by adding nine to the lowest channel number, ten is subtracted from the current channel number. If the current channel number is equal to or less than the value obtained by adding nine to the lowest channel number, the microcomputer 12 changes the current channel number into the highest channel number. Then, the microcomputer 12 outputs tuning data corresponding to the changed channel number to the tuner 13 in FIG. 4. Simultaneously, the microcomputer 12 displays the changed channel number through a display (not shown) and then completes the routine.

At this time, under the condition that the channel selecting knob 35 is not pushed, i.e., the tact switch 25a is in an off state, the microcomputer 12 performs the same operation as that described with reference to FIG. 10B. As a result, the channel number is decremented by ten.

In accordance with the alternative embodiment of the present invention, the channel recall function and the TV/CATV mode changing function may be performed without using the key switch 48. That is, the channel recall function and the TV/CATV mode changing function can simultaneously be performed by a time lag of the tact switch 25a provided on the rotary encoder 25. An interrupt routine for the change of channel is the same as that mentioned above. This operation will now be described with reference to FIG. 16.

First, if the channel change signals are generated and thus applied as interrupt signals, the interrupt routine is performed as shown in FIGS. 10A and 10B or 15A and 15B. If no interrupt signal is applied, the microcomputer 12 checks a state of the signal S3 output from the tact switch 25a provided on the rotary encoder 25. If the signal S3 is high, i.e., if the tact switch 25a has been pushed, the microcomputer 12 checks whether an operation of a timer (not shown) has been set. If the operation of the timer has been set, the microcomputer 12 increments a counter (not shown) of the timer by one and then completes the routine. If the operation of the timer has not been set, the microcomputer 12 sets the operation of the timer and then completes the routine.

At this time, if the user continues to push the tact switch 25a, the counter continues to be incremented by one. Then, if the user releases his or her pushing of the tact switch 25a the signal S3 becomes low. At this time, the microcomputer 12 checks whether the operation of the timer has been set. If the operation of the timer has not been set, the microcomputer 12 resets the timer and then checks whether the time value of the counter is not less than a broadcasting mode change time value. If the time value of the counter is not less than the broadcasting mode change time value, the microcomputer 12 changes the current broadcasting mode from the TV broadcasting mode into the CATV broadcasting mode and vice-versa and then performs the channel change and the display of the changed channel. Then, the microcomputer 12 initializes the counter and then completes the routine.

On the other hand, if the time value of the counter is less than the broadcasting mode change time value, the microcomputer 12 checks whether the time value of the counter is not less that a chattering noise time value. If the time value of the counter is not less than the chattering noise time value, the microcomputer 12 performs the channel recall function of displaying the current channel number and then initializes the counter. If the time value of the counter is less than the chattering noise time value, the microcomputer 12 regards the time value of the counter as an error value due to the chattering noise, and thus initializes the counter and then completes the routine. In this manner, the channel recall function and the TV/CATV mode changing function can be performed together with the channel changing function by the time lag of the tact switch 25a provided on the rotary encoder 25.

Accordingly, the channel recall function and the TV/CATV mode changing function can be performed although a separate key switch is not provided on the external panel of the television set.

As hereinbefore described, the present invention can provide the following advantages:

First, channel selection can smoothly be performed in comparison with the conventional tuning apparatus of the rotary type utilizing mechanical contacts.

Second, any user can readily select a desired channel, in that they need not memorize broadcasting channel numbers with assistance of the rotary encoder.

Third, rapid changing of channel is enabled even though the desired channel is separated from the current channel.

Fourth, there is no need for a key matrix unit or the remote controller which has been employed in the conventional tuning apparatus of the remote control type and the rotary type. Therefore, the tuning apparatus of the present invention is economical.

Fifth, the rotary encoder is smaller in volume and price than the conventional mechanical rotary knob, resulting in ease in manufacturing and economization.

Sixth, there is present two trigger input signals to the microcomputer as channel select and change signals. Therefore, there is little noise influence, in comparison with the conventional tuning apparatus utilizing only one trigger signal.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A tuning apparatus for a television system, comprising:

rotary encoding means, including a slidable and rotatable channel changing mechanism, said rotary encoding means outputting a plurality of signals with varying phases in accordance with a rotation of said channel changing mechanism;

control means for calculating a channel number in accordance with the plurality of signals from said rotary encoding means and outputting channel receive data corresponding to the channel number; and tuning means for receiving a television broadcasting signal of a channel corresponding to the channel receive data from said control means and for tuning said television system to the television broadcasting signal.

2. The tuning apparatus of claim 1, wherein said rotary encoding means further includes a plurality of switches for outputting a different plurality of signals.

3. The tuning apparatus of claim 1, wherein said rotary encoding means further includes, a shaft assembly, mounted to said channel changing mechanism, including a circular disc on which a terminal member is mounted, said terminal member having a plurality of resilient slit terminals integrally formed at an end thereof, and a printed circuit board, having a plurality of printed patterns for contacting said plurality of resilient slit terminals of said terminal member, in order to generate said plurality of signals with varying phases.

4. The tuning apparatus of claim 3, said rotary encoding means further including, a switch shaft mounted to said shaft assembly, and a pair of resilient tact terminals spaced apart from each other, said tact terminals providing an electric signal for tuning control.

5. A method of controlling tuning in a television system, comprising the steps of:

(a) simultaneously generating two signals with a phase difference with respect to each other, corresponding to a channel change if a current channel value is changed by a channel changing mechanism;

(b) generating a channel increment signal or channel decrement signal and error signal, in accordance with the two signals;

(c) calculating a new channel value in accordance with the channel increment direction or the channel decrement direction; and (d) tuning a tuner of said television system with channel receive data corresponding to the new channel value such that said tuner selects a new channel corresponding to the new channel value.

6. The method of claim 5, wherein said step(b) includes the sub-steps of:

(b)(1) determining if both of the two signals corresponds to a channel increment direction, (b)(2) determining if both of the two signals corresponds to a channel decrement direction, (b)(3) setting the error signal equal to the leading signal of the two signals if both signals do not correspond to the channel increment direction, and (b)(4) setting the error signal equal to the following signal of the two signals if both signals do not correspond to the channel decrement direction.

7. The method of claim 6, wherein the leading signal is utilized to determine the channel decrement direction and the following signal is utilized to determine the channel increment direction.

8. The method of claim 5, wherein said step (c) includes the sub-steps of:

(c)(1) changing the current channel value into a lowest channel value that can be tuned by said television system if a following signal of the two signals corresponds to the channel increment direction and the current channel value is the highest channel value that can be tuned by such television system, (c)(2) incrementing the current channel value by one if the following signal corresponds to the channel increment direction and the current channel value is not the highest channel value, (c)(3) changing the current channel value into the highest channel value if the following signal corresponds to the channel decrement direction and the current channel value isi the lowest channel value, and (c)(4) decrementing the current channel value by one if the following signal corresponds to the channel decrement direction and the current channel value is not the lowest channel value.

9. The method of claim 5, further comprising the steps of:

(e) receiving a channel skip signal; and (f) calculating a channel skip value in accordance with the channel increment direction or the channel decrement direction.

10. The method of claim 9, wherein said step (f) includes the sub-steps of:

(f) (1) subtracting a predetermined positive integer from the current channel value if the current channel value is greater than a value obtained by adding the predetermined positive integer minus one to the lowest channel value in the channel decrement direction, (f) (2) changing the current channel value into the highest channel value if the current channel value is equal to or less than the value obtained by adding the predetermined positive integer minus one to the lowest channel value in the channel decrement direction, (f) (3) adding the predetermined positive integer to the current channel value if the current channel value is less than a value obtained by subtracting the predetermined positive integer minus one from the highest channel value in the channel increment direction, and (f) (4) changing the current channel value into the lowest channel value if the current channel value is equal to or greater than the value obtained by subtracting the predetermined positive integer minus one from the highest channel value in the channel increment direction.

11. A method of controlling tuning in a television system that includes a channel changing mechanism that can be rotated, comprising the steps of:

(a) performing a channel change corresponding to a current broadcasting mode if a channel change signal is generated as a function of rotation by said channel changing mechanism;

(b) recalling and displaying a current channel value in the current broadcasting mode if a channel recall signal is generated as a function of the channel changing mechanism being moved;

(c) changing the current broadcasting mode into a desired broadcasting mode if a broadcasting mode change signal is generated; and (d) performing a channel change corresponding to the broadcasting mode change signal in accordance with the inputted channel change signal and displaying the changed channel value.

12. The method of claim 11, further comprising the step of:

(e) recalling and displaying the current channel value in the current broadcasting mode if the channel recall signal is generated by the channel changing mechanism.

13. A method of controlling tuning in television system, comprising the steps of:

(a) performing a channel change corresponding to a current broadcasting mode if a channel change signal is generated by a channel changing mechanism;

(b) setting a timer if no channel change signal is generated and a recall function signal and broadcasting mode change are generated;

(c) counting a period of time during which the recall function signal and broadcasting mode change are generated if the timer is set;

(d) resetting the timer if recall function signal and broadcasting mode change are terminated;

(e) comparing the counted time value of the timer with a present time value;

(f) changing the current broadcasting mode and performing the channel change corresponding to the changed broadcasting mode in accordance with the channel corresponding to the changed broadcasting mode in accordance with the channel change signal, or performing a channel recall function in the current broadcasting mode depending on the comparison in step(e); and (g) displaying a channel value in the changed broadcasting mode or the current channel value in the current broadcasting mode in accordance with the recall function signal.

14. The method of claim 13, wherein said step (f) includes the steps of, (f-1) changing the current broadcast mode if the counted time value is not less than a broadcasting mode change time value, (f-2) performing the channel recall function if the counted time value is less than the broadcasting mode change time value and is not less than a chattering noise time value, and (f-3) resetting the timer if the counted time value is less than the chattering noise time value.

* * * * *